United States Patent [19]
Messerman et al.

[11] Patent Number: 5,943,487
[45] Date of Patent: *Aug. 24, 1999

[54] METHOD FOR EXTRACTING A RESISTOR NETWORK FROM AN INTEGRATED CIRCUIT POLYGON LAYOUT

[75] Inventors: Dmitry Messerman; Gershon Hochman, both of Haifa, Israel

[73] Assignee: Intel Corporation, Santa Clara, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/679,197

[22] Filed: Jul. 12, 1996

[51] Int. Cl.$^6$ .............................. G06F 17/00; G06F 17/50
[52] U.S. Cl. ................................. 395/500.12; 395/500.04; 395/500.05
[58] Field of Search ...................................... 364/488–491

[56] References Cited

U.S. PATENT DOCUMENTS

| 5,210,699 | 5/1993 | Harrington ............................... 364/488 |
| 5,452,224 | 9/1995 | Smith, Jr. et al. ...................... 364/488 |
| 5,598,348 | 1/1997 | Rusu et al. ............................... 364/491 |

OTHER PUBLICATIONS

Wang et al. "Accurate Parasitic Resistance Extraction for Interconnection Analysis," IEEE, May 1, 1995, pp. 255–258.

"Resistance Extraction from Mask Layout Data," Horowitz, H. Dutton, R.W., *IEEE Transactions on Computer–Aided Design*, vol. CAD–2, No. 3, pp. 145–150, Jul. 1983.

"An Algorithm for Resistance Calculation from IC Mask Pattern Information," Yoshimura, H. et al., *1979 ISCAS Proceedings*, IEEE Catalog No. 79 CH1421–7 CAS, pp. 478–481, Jul. 17–19, 1979.

*Primary Examiner*—Eric W. Stamber
*Assistant Examiner*—Vuthe Siek
*Attorney, Agent, or Firm*—Blakely, Sokoloff, Taylor & Zafman

[57] ABSTRACT

A method for extracting a reduced resistor network from an integrated circuit polygon layout is disclosed. The polygon layout includes a Manhattan polygon defined by a plurality of boundary lines. The method involves fracturing the Manhattan polygon along first and second division lines which extend from an intersection point at which first and second boundary lines intersect to define a 270 degree angle within the polygon. The first and second division lines extend parallel to the first and second boundary lines respectively and traverse the polygon so as to fracture the polygon into a number of rectangles. Each rectangle is substituted, or modeled, with a star configuration resistor arrangement, so as to construct a full resistor network. The method then enters an iterative sequence in which network reduction opportunities within the full resistor network are identified, and data concerning each network reduction opportunity is stored. The full resistor network is then reduced to a reduced resistor network by performing a series of reduction steps.

9 Claims, 10 Drawing Sheets

$$R1 = R3 = \frac{1}{2}\rho\frac{x}{y} \qquad R2 = R4 = \frac{1}{2}\rho\frac{y}{x}$$

REMOVING DANGLING RESISTORS:

CONSOLIDATING SERIAL RESISTORS

CONSOLIDATING PARALLEL RESISTORS

STAR-TO-TRIANGLE TRANSFORM

METHOD FOR EXTRACTING A RESISTOR NETWORK FROM AN INTEGRATED CIRCUIT POLYGON LAYOUT

FIELD OF THE INVENTION

The present invention pertains to the field of integrated circuit design and simulation. More particularly, the present invention relates to a method for extracting a resistor network from an integrated circuit polygon layout and for simulating direct current (DC) flow within the integrated circuit.

BACKGROUND OF THE INVENTION

Electromigration (EM) is the motion of ions through a conductor in response to the passage of current through the conductor. A divergence of ionic flux under the force of an "electron wind" may lead to the creation of vacancies, thus forming voids or holes in the conductor. The growth of the voids within a conductor may eventually lead to an open-circuit failure of the conductor. Accordingly, electromigration is a serious and destructive wear out phenomenon.

Electromigration within the power supply circuitry (also termed the "power net") of an integrated circuit (IC) has serious consequences for the reliability of the IC, and also serves to reduce substantially the product life of the IC. The metal lines, vias, substrate taps and contacts which comprise the power net of an IC must all comply with predetermined electromigration design specifications to ensure the reliability of the IC. More specifically, the direct current flow through each fragment of the power net must be established, and compared to a predetermined maximum direct current threshold for the power net fragment in a process known as electromigration analysis.

The direct current flow through each power net fragment is established by performing a simulation of the operation of the power net and determining the anticipated voltage and current characteristics of the power net. Such simulations of the operation of the power net of an IC are often conducted on a resistor network "extracted" or derived from the symbolic layout of an IC. Resistor networks are typically extended from the symbolic layout of an IC soley for the purpose of simulating the electrical characteristics of the IC. Symbolic layouts provide a convenient and readily available representation of the IC from which to extract a resistor network.

Symbolic layout techniques allow an IC designer to produce a low-level representation of the layout of an IC, while alleviating some of the burden associated with polygon layout techniques. More specifically, when creating a polygon layout (also commonly termed the "mask layout" or "mask pattern") of an IC in the first instance, a designer is required to locate every conductor via and contact of every component. Accordingly, the design of a simple transistor can require the designer to locate a number of transistor components. Furthermore, an IC designer creating a polygon layout must have a thorough understanding of the geometric design rules associated with polygon layout techniques.

Symbolic layout techniques provide a higher degree of design abstraction and automation and allow the IC designer to access a library of pre-defined symbols for regularly repeated components or cells. For example, a predetermined transistor structure could be symbolically defined, thus allowing the designer to repeat the transistor structure in a representation of an IC fragment in the so-called "symbolic domain". This representation is then termed the symbolic layout of the IC fragment. A number of design tools for producing symbolic layouts are commercially available, such as the Virtuoso® IC layout package developed by Cadence Design Systems, Inc., of San Jose, Calif. The symbolic layout may then be used automatically to generate a polygon (or mask) layout for the IC. For example, the Virtuoso® layout package includes a "compactor" for converting and compacting symbolic layouts into polygon layouts.

Once a resistor network has been extracted from the symbolic layout, the process enters a network reduction phase, wherein the resistor network is "reduced" according to well-known reduction techniques. Specifically, the resistors which comprise the resistor network may be combined in various ways to reduce the size and complexity of the resistor network. The electrical performance of the extracted portion of the IC, represented by the "reduced" resistor network, can then be simulated on a number of simulation software packages, such as SPICE, Spectre® or TimeMill®, to perform the electromigration analysis.

A number of problems are associated with extracting a resistor network from a symbolic layout. The symbolic layout must be "clean" before the resistor network can be properly extracted. A "clean" symbolic layout is one in which all cells or components are properly connected and not overlayed on each other, and information regarding current flow in the IC is correctly represented. The process of generating a "clean" symbolic layout for the purposes of resistor network extraction is a time-consuming and labor intensive exercise.

It is also known to extract resistance information from a polygon layout representation of an IC. One such disclosure is given by M. Horowitz and R. W. Dutton, "Resistance Extraction from Mask Layout Data," IEEE Transactions on CAD, Vol. CAD-2, No. 3, July 1983, pp. 145–150. The document discloses fracturing a complex polygon into a number of smaller pieces or fragments for resistance extraction. Specifically, the algorithm requires the determination of current flow within the polygon, and proposes fracturing the polygon along lines perpendicular to the current flow. This algorithm, however, results in a collection of polygon fragments having irregular and complex shapes. The calculation of resistance values for these polygons of irregular shape may be difficult and is not suited for fast resistor network reduction during the network reduction phase discussed above.

In the article by H. Yoshimura, K. Tansho, N. Ohwada, and T. Nishide, "An Algorithm for Resistance Calculation from IC Mask Pattern Information," Proc. Int. Symp. Circuits and Systems, pp. 478–481, 1979, there is disclosed a method of dividing polygons into rectangles by drawing vertical and horizontal lines from all vertexes of a polygon. However, this division is performed merely to determine current direction and not for the purposes of extracting a resistor network from the polygon.

As the number of active components implemented within an IC grows, the determination of the electrical characteristics, and particularly the electromigration analysis process, is becoming increasingly taxing on simulation software. Known techniques of electromigration analysis can require a number of days to complete as a result of the time required for the fracturing of polygons, the calculation of resistance values for complex polygon fragments, and the simulation of a resistor network comprising millions of resistors. Therefore, a need exists for a method which balances the speed and accuracy requirements of the electromigration analysis process.

SUMMARY OF THE INVENTION

According to a first aspect of the invention there is provided a method for extracting a resistor network from an integrated circuit polygon layout. Only the polygons that represent the power supply network of the integrated circuit are extracted. The polygon layout includes Manhattan polygons, each defined by a plurality of boundary lines. The method involves fracturing each Manhattan polygon along first and second division lines which extend from an intersection point at which first and second boundary lines intersect to define an angle of greater than 180 degrees (such as 270 degrees) within the polygon. The first and second division lines extend parallel to the first and second boundary lines respectively and traverse the polygon so as to fracture the polygon into a number of rectangles. Each rectangle is substituted, or modeled, with a star configuration resistor arrangement, so as to construct a full resistor network. This extraction method provides a network that can be effectively reduced.

According to a second aspect of the invention, there is provided a method of resistor network reduction. The method involves an iterative sequence in which network reduction opportunities within the full resistor network are identified. Each time a reduction opportunity is detected, data concerning the reduction opportunity is stored, and the network reduced accordingly. A simulation operation of the reduced resistor network is used to determine operational voltages at the nodes of the reduced resistor network. The operational voltages of the full resistor network can then be determined from the operational voltages at the nodes of the reduced resistor network and from the stored data concerning the network reduction opportunities.

According to a third aspect of the invention there is provided a method of determining the electrical characteristics of an integrated circuit. The method involves reducing a full resistor network extracted from the polygon layout of an IC, and then simulating operation of the reduced resistor network to determine operational voltages at the nodes of the reduced resistor network. The operational voltages at the nodes of a full resistor network can then be determined from the operational voltages at the nodes of the reduced resistor network and the stored data concerning the network reduction opportunities.

Other features of the present invention will be apparent from the accompanying drawings and from the detailed description which follows.

BRIEF DESCRIPTION OF THE DRAWINGS

The present invention is illustrated by way of example and not limitation in the figures of the accompanying drawings, in which like references indicate similar elements and in which.

DETAILED DESCRIPTION

A method of extracting a resistor network from an integrated circuit (IC) polygon layout is described. In the following description, for purposes of explanation, numerous specific details are set forth in order to provide a thorough understanding of the present invention. It will be evident, however, to one skilled in the art that the present invention may be practiced without these specific details.

For the purposes of this specification, the term "polygon layout" shall be synonymous with the terms "mask layout" and "mask pattern", and shall be regarded as interchangeable with either of these terms. The term "Manhattan polygon" shall be taken to refer to a polygon for which all pairs of boundary lines intersect at right angles, so as to define either a 90 degree or a 270 degree angle between them. The term "power net" shall be taken to refer to the power supply network of an integrated circuit (IC), and may include the conductors, contacts, vias, wire segments and taps of such a power supply network.

Figure 1:
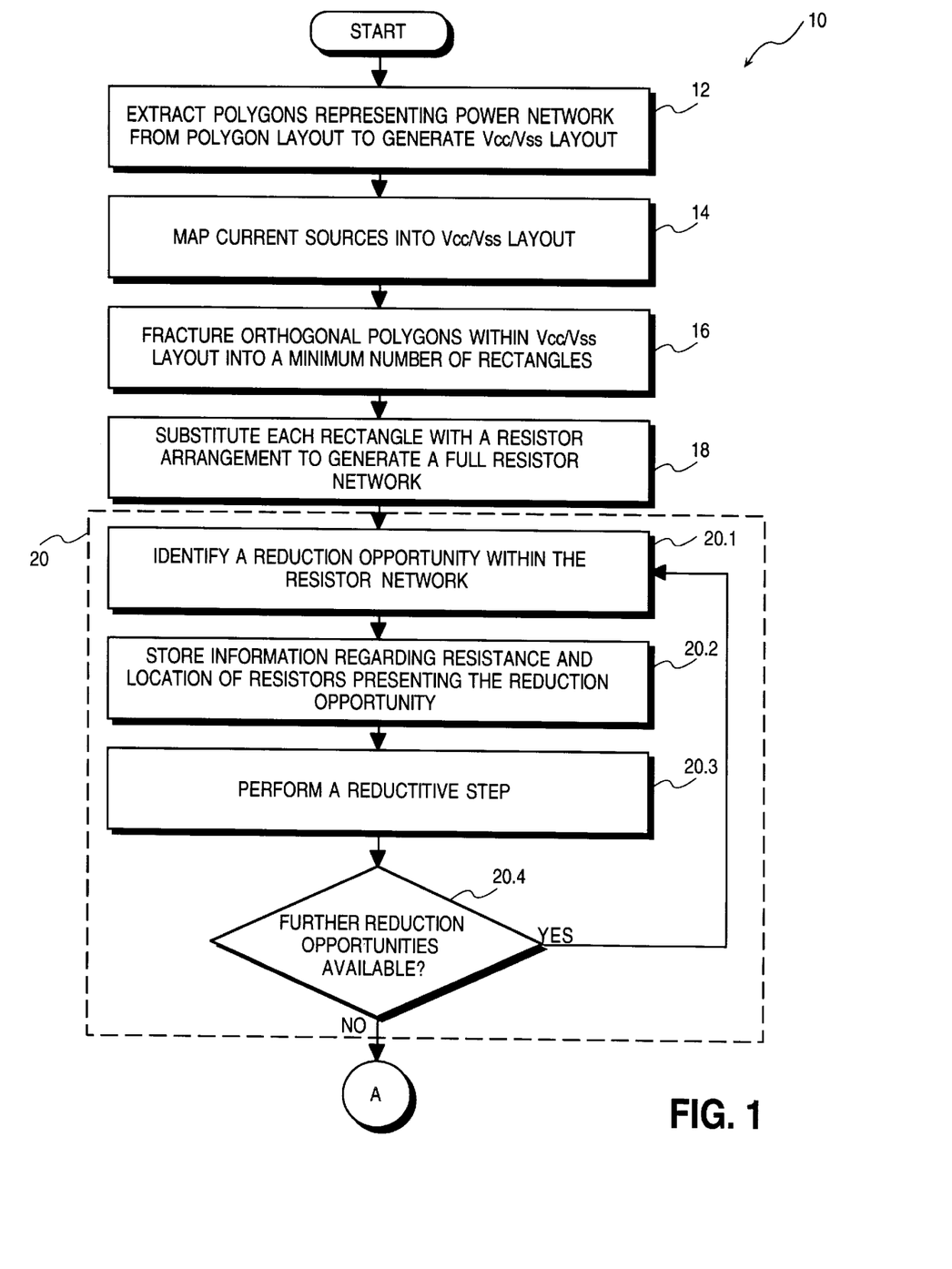
FIG. 1 is a flow-chart illustrating one embodiment of a method of extracting a reduced resistor network from a polygon layout of an IC.
Figure 2:
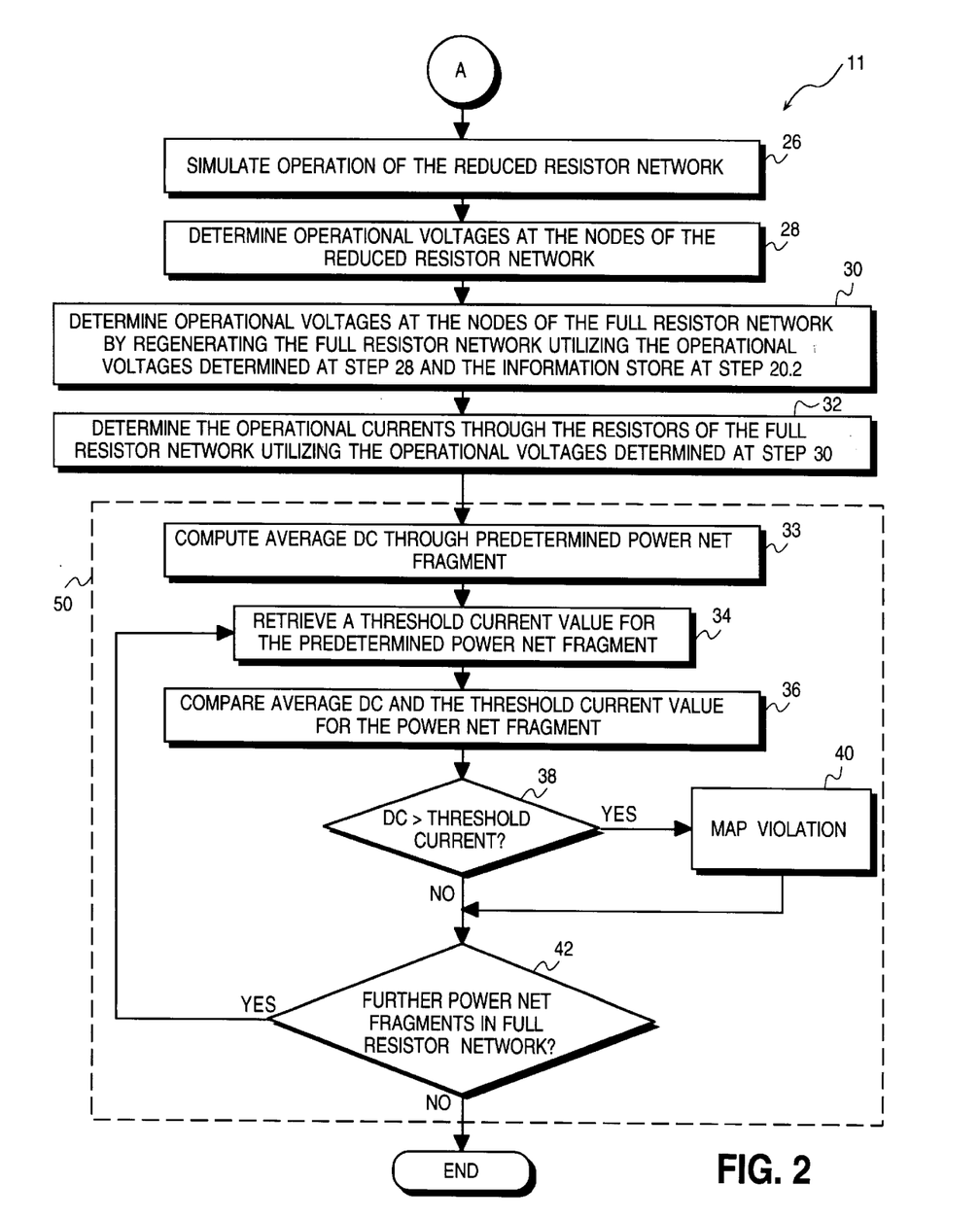
FIG. 2 is a flow-chart illustrating one embodiment of a method of determining the electrical characteristics of a power net of an IC.

FIG. 1 is a flow-chart illustrating a method 10 of extracting a resistor network from the polygon layout of an IC. FIG. 2 is a flow-chart illustrating a method 11 of determining the electrical characteristics of the power net of the IC, utilizing a reduced resistor network produce by the method 10 of FIG. 1.

For the purposes of electromigration analysis, only the electrical characteristics of the power net may need to be determined. Accordingly, referring to FIG. 1, at step 12 polygons representing only the power supply network (or power net) are extracted from the polygon layout of the IC to generate a so-called "Vcc/Vss polygon layout". At step 14, current sources are mapped into the Vcc/Vss polygon layout. In one embodiment, information regarding the current sources is obtained from a circuit analysis tool, which generates a CRNT file, containing current source information, which is then mapped into the Vcc/Vss polygon layout. At step 16, Manhattan polygons within the Vcc/Vss layout are fractured into a minimum number of rectangles, as is more fully described below.

The fracturing step 16 is performed for each Manhattan polygon included within the Vcc/Vss layout.

Figure 3:
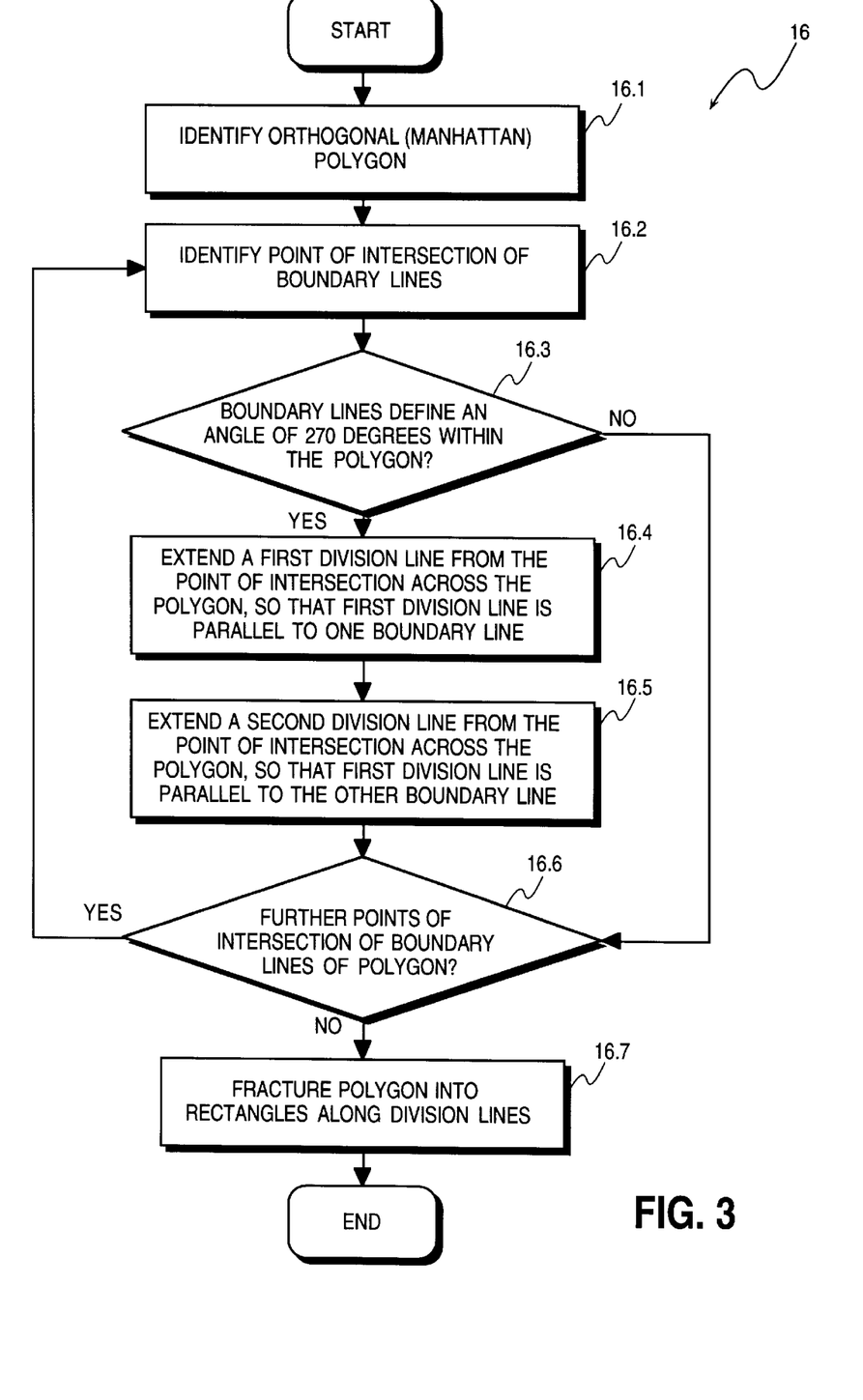
FIG. 3 is a flow-chart illustrating one embodiment of a method of fracturing a Manhattan polygon into a plurality of rectangles.

The step or method 16 by which a Manhattan polygon within the Vcc/Vss layout is fractured into rectangles is depicted in the flow-chart of FIG. 3, and in FIGS. 4A–4D and 5A–5C. Referring to FIG. 3, the step 16.1 requires the identification of a Manhattan polygon within the Vcc/Vss layout. Some polygons within the Vcc/Vss polygon layout may not be Manhattan. Such polygons may be "sculptured" into Manhattan polygons, as shown in FIGS. 5D and 5E.

The fracturing method 16 then proceeds to step 16.2, where a point of intersection of a pair of boundary lines of a selected polygon is identified. A point of intersection between boundary lines having been identified, the method proceeds to decision block 16.3, where it is determined whether the pair of boundary lines define an angle greater than 180 degrees, and more specifically an angle of 270 degrees, between them and inside the selected polygon. Should the angle defined by the pair of boundary lines within the polygon not be 270 degrees, the method 16 proceeds to decision block 16.6, where a determination is made as to whether there exist any further points of intersection between boundary lines which have not yet been scrutinized by the method 16. If there are further points of intersection which require scrutiny, the method returns to step 16.2. Alternatively, if all points of intersection of the polygon have been examined, then the method 16 terminates.

Figure 4A:
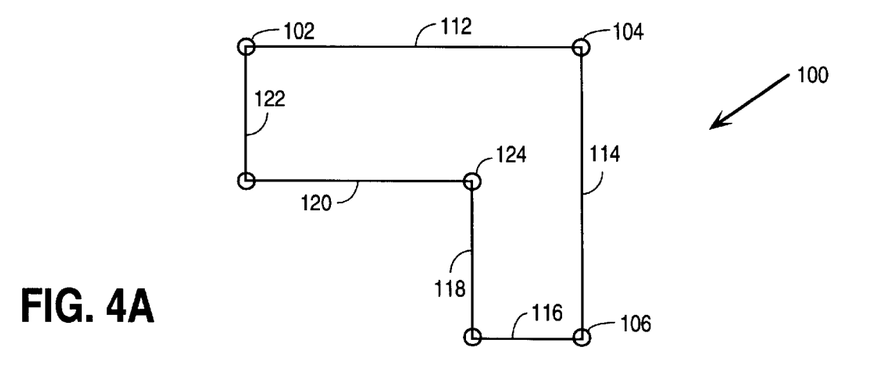
FIGS. 4A–4D show a simple Manhattan polygon to which the method of fracturing illustrated in the flow-chart of FIG. 3 is applied.
Figure 4B:
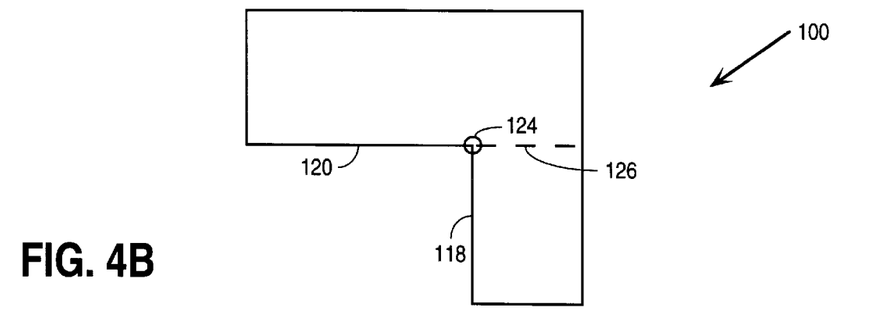
Figure 4C:
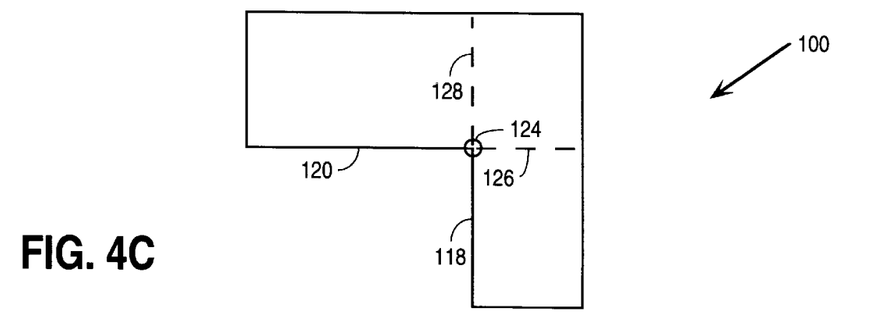

Referring to FIG. 4A, there is shown a Manhattan polygon 100, having six points of intersection 102–110 and 124 between pairs of boundary lines 112–122, which define the polygon 100. The method 16 will be discussed below as applied to the polygon 100, as the polygon 100 provides an example of a simple polygon structure which will clearly illustrate the fracturing method 16.

The method 16 proceeds as described above for each of the points of intersection 102–110, until point of intersection 124 is examined. Decision block 16.3 of the method 16 will determine that boundary lines 118 and 120 of polygon 100 define an angle of 270 degrees within the polygon 100. Accordingly, the method 16 will then proceed from decision block 16.3 to step 16.4, at which a first division line 126 (shown as a broken line) is extended from the point of intersection 124 so that it traverses the polygon 100, and is parallel to the boundary line 120. This step is graphically illustrated in FIG. 4B.

Figure 4D:
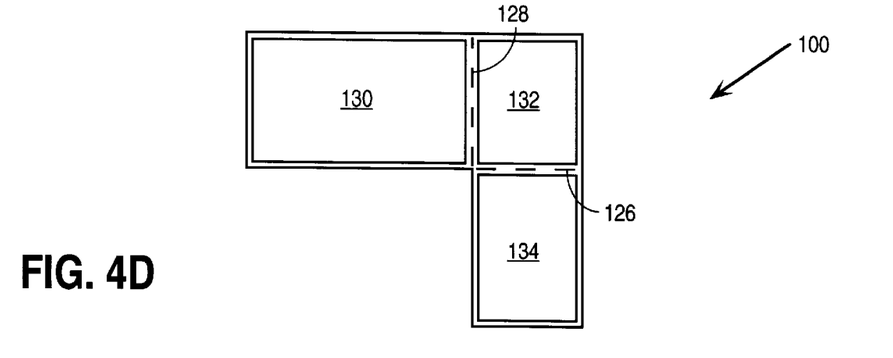

At step 16.5, a second division line 128 (also shown as a broken line) is extended from the point of intersection 124 so that it traverses the polygon 100, and is parallel to the boundary line 118. This step is graphically illustrated in FIG. 4C. Having inserted the first and second division lines at steps 16.4 and 16.5, the method proceeds to decision block 16.6, at which the determination described above is performed. If it is determined that all points of intersection of the boundary lines 112–122 of a polygon 100 have been examined, the method 16 proceeds to step 16.7, at which the polygon 100 is fractured into rectangles. The polygon 100 is fractured along the division lines 126 and 128 into three rectangles 130–134, as shown in FIG. 4D.

Figure 5A:
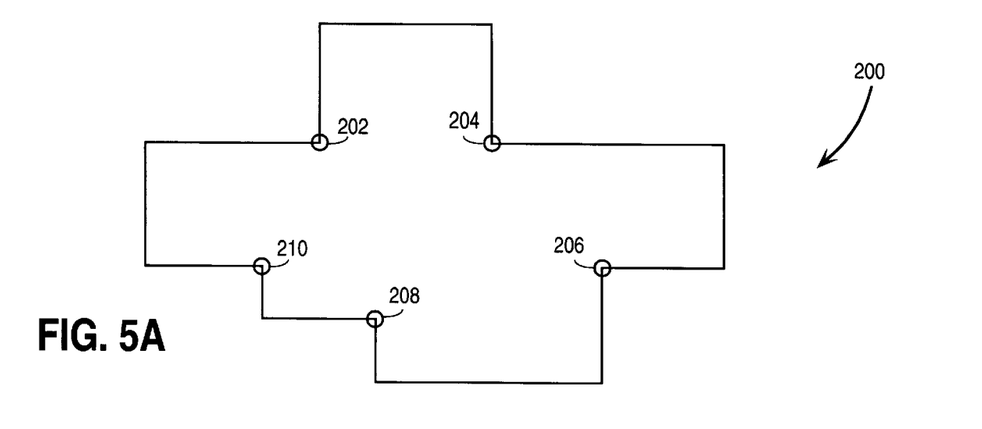
FIGS. 5A–5C show a complex Manhattan polygon to which the method of fracturing illustrated in the flow-chart of FIG. 3 is applied.
Figure 5B:
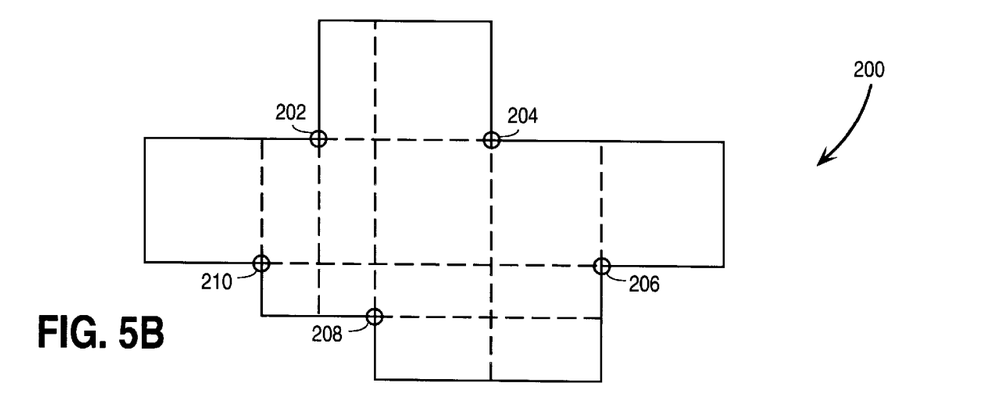
Figure 5C:
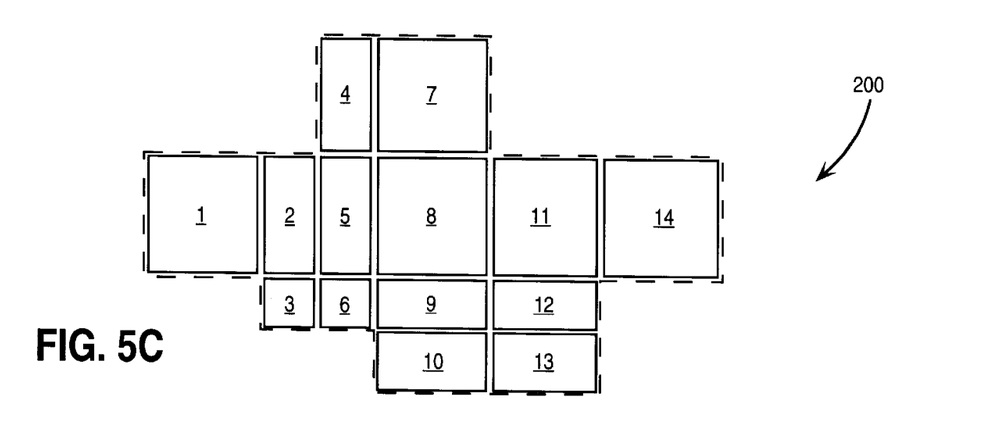
Figure 5D:
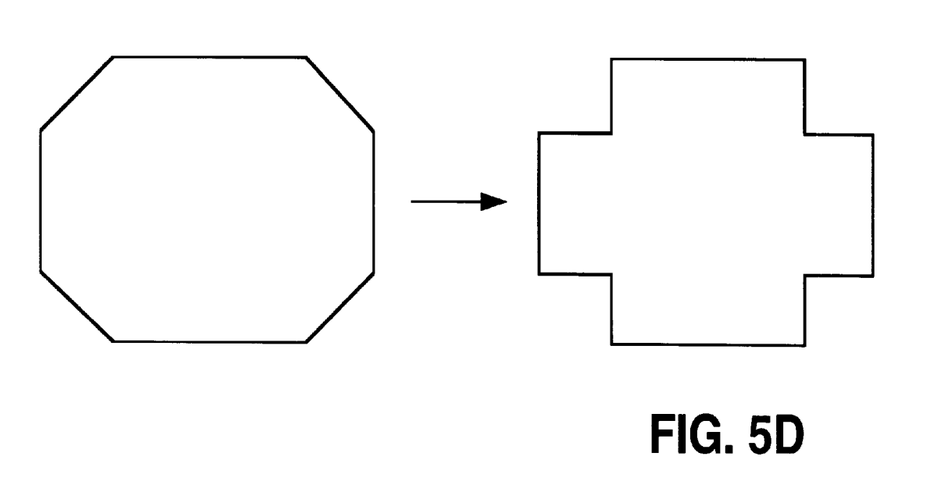
FIGS. 5D–5E show how non-Manhattan polygons can be sculptured to become Manhattan.
Figure 5E:
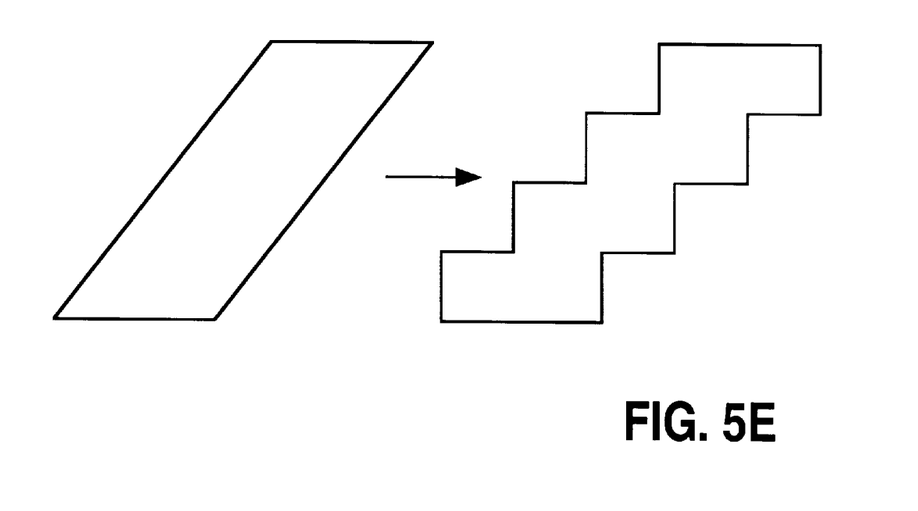

FIGS. 5A–5C show a Manhattan polygon 200, having a more complex shape than polygon 100, to which the method 16 described above has been applied. As shown in FIG. 5A, the polygon 200 has five points of intersection 202–210 between boundary lines at which the respective pairs of boundary lines define angles of 270 degrees within the polygon 200. First and second division lines traverse the polygon 200 from each of the points of intersection 202–210, as shown in FIG. 5B. The method 16 is thereafter applied to fracture the polygon 200 into fourteen rectangles, as shown in FIG. 5C.

Figure 6:
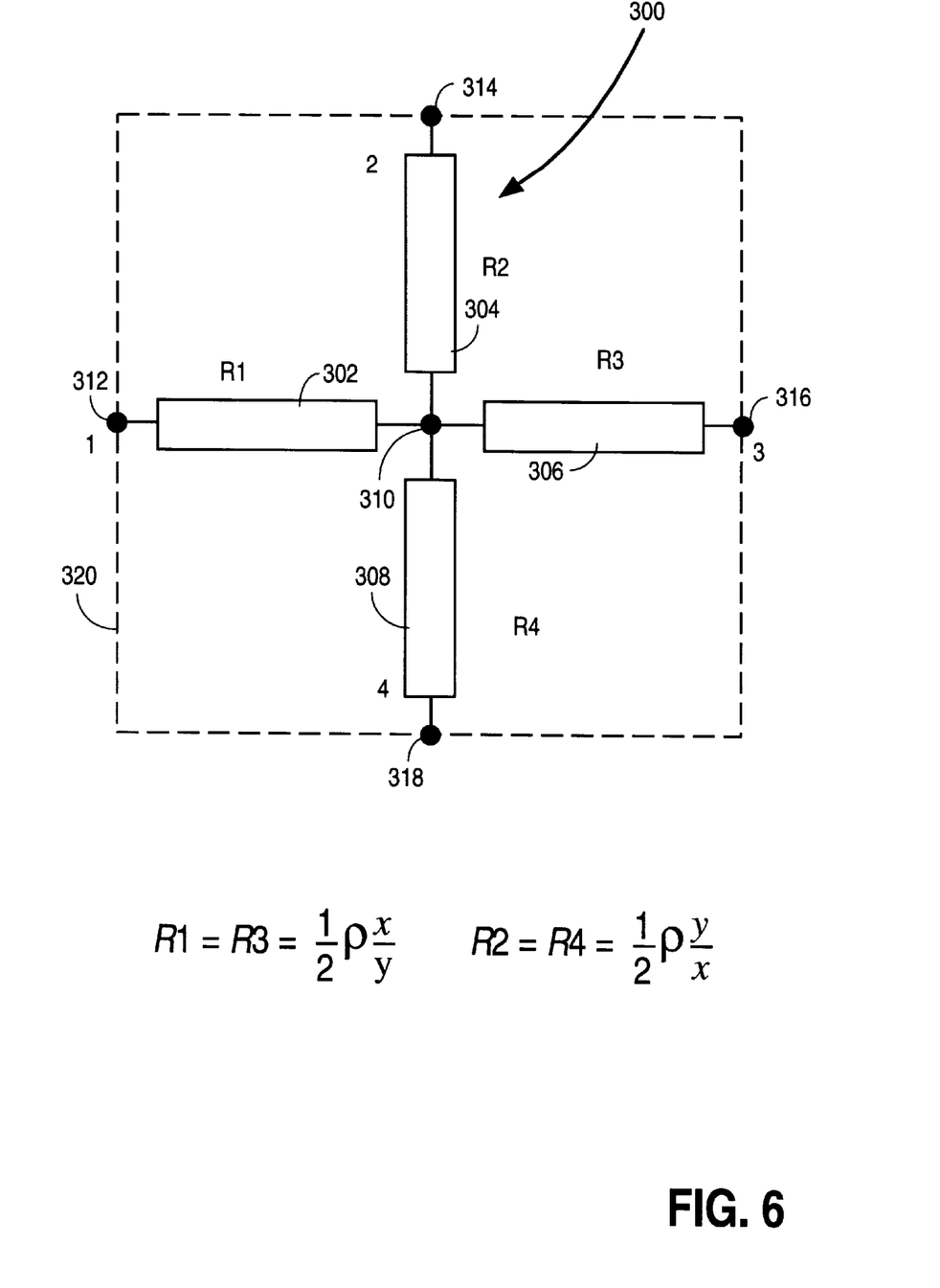
FIG. 6 shows a resistor arrangement with which the plurality of rectangles, into which polygons are fragmented by the method illustrated in FIG. 3, are substituted.

Referring again to FIG. 1, having completed the fracturing of all Manhattan polygons within the Vcc/Vss layout into rectangles, the method 10 proceeds to step 18, at which each of the rectangles generated at step 16 is substituted by a resistor arrangement 300, one example of which is shown in FIG. 6, to generate a full resistor network. The resistor arrangement 300 shown in FIG. 6 comprises four resistors 302–308, which are connected in a star configuration at a common node 310. Contacts 312–318 are also located at a short end of each resistor 302–308 opposite a short end connected to the common node 310. Accordingly, each resistor arrangement is provided with four contacts 312–318 so that one of contacts 312–318 replaces each boundary line of a rectangle 320 being substituted by the resistor arrangement 300. By providing a contact along each of the boundary lines of the substituted rectangle 320, electrical connectivity between resistor arrangements 300 which substitute adjacent rectangles is assured. It will of course be appreciated that the number and configuration of the resistors between the four contacts 312–318 may vary considerably.

In the illustrated embodiment, the values of the resistors are identical and calculated according to the following formula:

$$R1 = R3 = \tfrac{1}{2}\rho x/y$$

$$R2 = R4 = \tfrac{1}{2}\rho y/x$$

where:

x is the substituted rectangle's length;

y is the substituted rectangle's width; and $\rho$ is the degraded metal resistivity for 100 degrees Celsius.

Figure 7A:
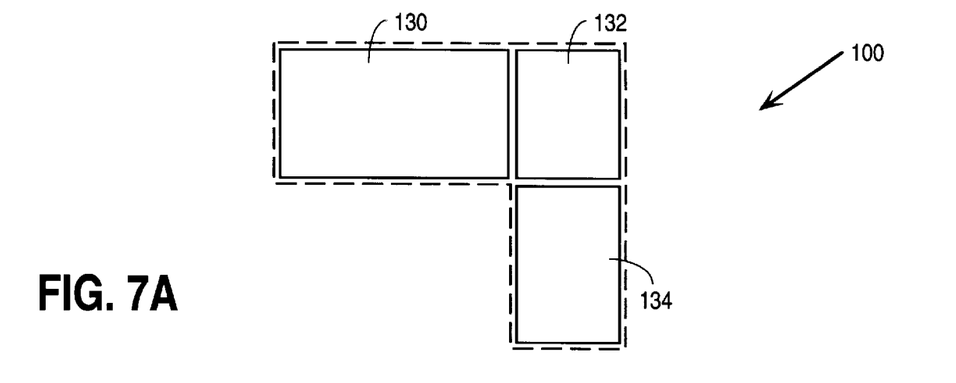
FIGS. 7A–7C show the substitution of each rectangle, into which the polygon of FIGS. 4A–4D is fractured, by the resistor arrangement shown in FIG. 6.
Figure 7B:
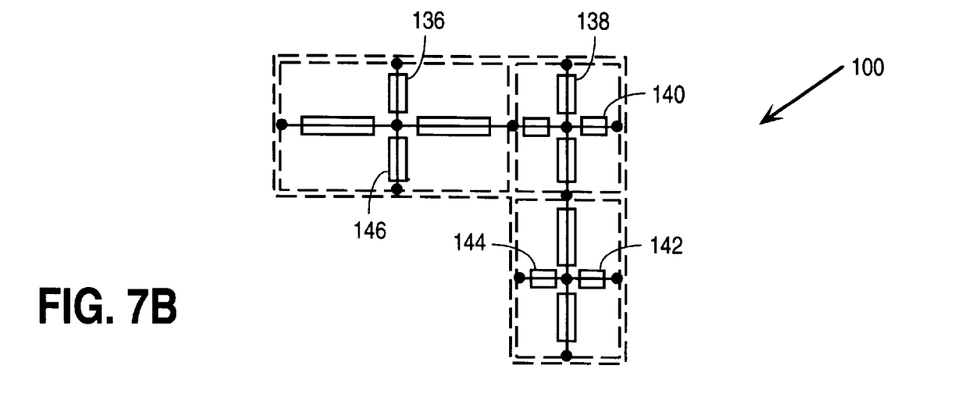

The substitution of the rectangles 130–134 of the polygon 100 is shown in FIGS. 7A and 7B. The resistor network shown in FIG. 7B is a full resistor network. Similarly, each of the fourteen rectangles of polygon 200, shown in FIG. 5C, are substituted at step 18 by the resistor arrangement 300 to generate a full resistor network.

Figure 8:
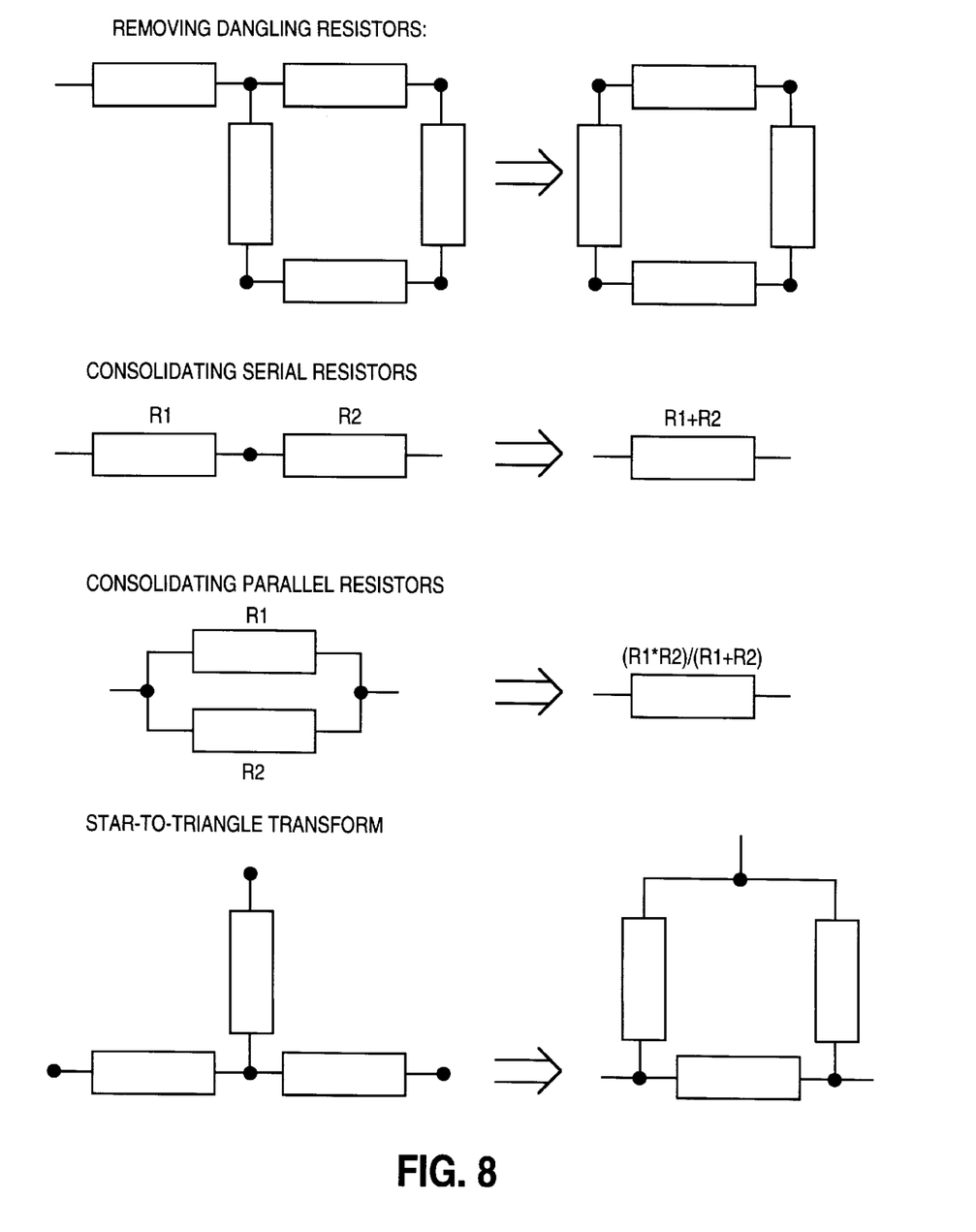
FIG. 8 illustrates a number of reduction opportunities that may exist within a full resistor network.

Returning to FIG. 1, the method 10 then enters a reduction sequence 20 for the reduction of a full resistor network to a reduced resistor network. The reduction sequence 20 comprises the steps 20.1 to 20.4. At step 20.1, a resistor network reduction opportunity is identified. Various examples of resistor network reduction opportunities are shown in FIG. 8. The illustrated resistor reduction opportunities include:

1. the removal of dangling resistors. For example, in FIG. 7B, assuming current flow from contact A to contact B, resistors 136–146 are regarded as dangling resistors, and can be removed to provide a partially reduced resistor network.

Figure 7C:
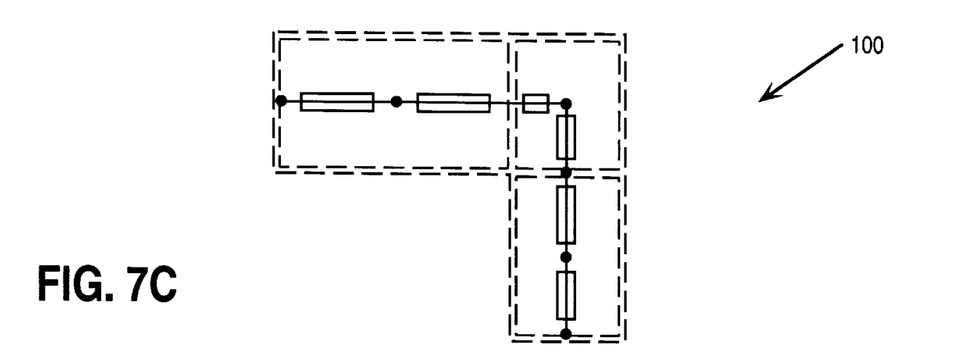

2. the consolidating of serial resistors. For example, all the resistors of the partially reduced network shown in FIG. 7C could be combined into a single resistor.

3. the consolidating of parallel resistors.

4. the transformation of a star resistor arrangement into a triangle resistor arrangement.

Having identified a resistor reduction opportunity at step 20.1, information regarding the resistance values and locations of all resistors presenting the resistor network reduction opportunity are stored at step 20.2.

As will described below, the information stored at step 20.2 is required to regenerate the full resistor network from a reduced resistor network. Having stored the appropriate resistance value and location information, the method proceeds to step 20.3, at which the reduction opportunity identified at step 20.1 is implemented. The reduction sequence 20 then proceeds to decision block 20.4, where a determination is made as to whether any further reduction opportunities exist. If so, the reduction sequence 20 performs another iteration. If not, the method 10 exits the reduction sequence 20 having generated a reduced resistor network.

Referring to FIG. 2, the method 11 of determining the electrical characteristics of the power net of an IC is shown. More specifically, the method 11 determines whether the direct current (DC) flow through any fragments of the power net of the IC violates electromigration specifications.

At step 26, operation of a reduced resistor network is simulated using simulation software, such as SPICE (developed by the University of California at Berkeley), Spectre® (developed by the University of California at Berkely), or TimeMill® (developed by Epic Design Technology, Inc., of Sunnyvale, Calif.). At step 28, the operational voltages at the nodes of the reduced network are determined from the simulation process. At step 30, "backwards propagation" or regeneration of the full resistor network is undertaken, utilizing the resistance value and location information stored at step 20.2, and the voltages at the nodes of the reduced network. Accordingly, at step 30, the voltages of the full, regenerated resistor network can be determined. Using the information concerning the resistance values of each resistor of the full resistor network and the voltage at each node of the full resistor network an estimation of direct current flow through each resistor of the full resistor network, and accordingly a specified power net fragment of the IC, can be made at step 30.

Electromigration violations occur when the current through a component, such as a conductor (or wire segment), via or contact of an active device implemented on an IC is too great. Whether or not the current is too great for a specific component depends on the width thereof, as well as the number and configuration of interconnected components. The maximum direct currents that can be permitted to flow through predetermined power net fragments are specified by electromigration design rules. Accordingly at step 33, the average direct current (DC) flow through each of these predetermined full power net fragments is calculated according to the equation:

$$I_{avg} = I_{tot} n_{cuts} / n_{total}$$

where:
$I_{tot}$—total current of the subblock provided in the CRNT file,
$n_{cuts}$—number of device diffusion contact cuts,
$n_{total}$—total number of contact cuts in the subblock.

CRNT file with DC currents of subblocks is provided by a circuit analysis tool (PLUS, PathMill etc.) which is external to method 11.

The method 11 then enters a violation identification and mapping sequence 50. The sequence 50 comprises a first step 34 of retrieving a threshold current value for a specific power net fragment, and then comparing the threshold current value to the average direct current flow though the specific power net fragment, as calculated at step 33. At decision block 38, if it is determined that the average direct current for the power net fragment is greater that the threshold current value, the sequence proceeds to step 40, where an electromigration violation is mapped. The sequence 50 then proceeds from step 40 to decision block 42, where it is determined whether all power net fragments have be examined. If not, the sequence 50 performs another iteration. Alternatively, should it be determined at decision block 38 that the average direct current does not exceed the threshold current value, the sequence 50 proceeds directly to the decision block 42. By performing an iteration of the violation identification and mapping sequence 50 for each power net fragment, a composite map of electromigration violations can be generated.

Figure 9:
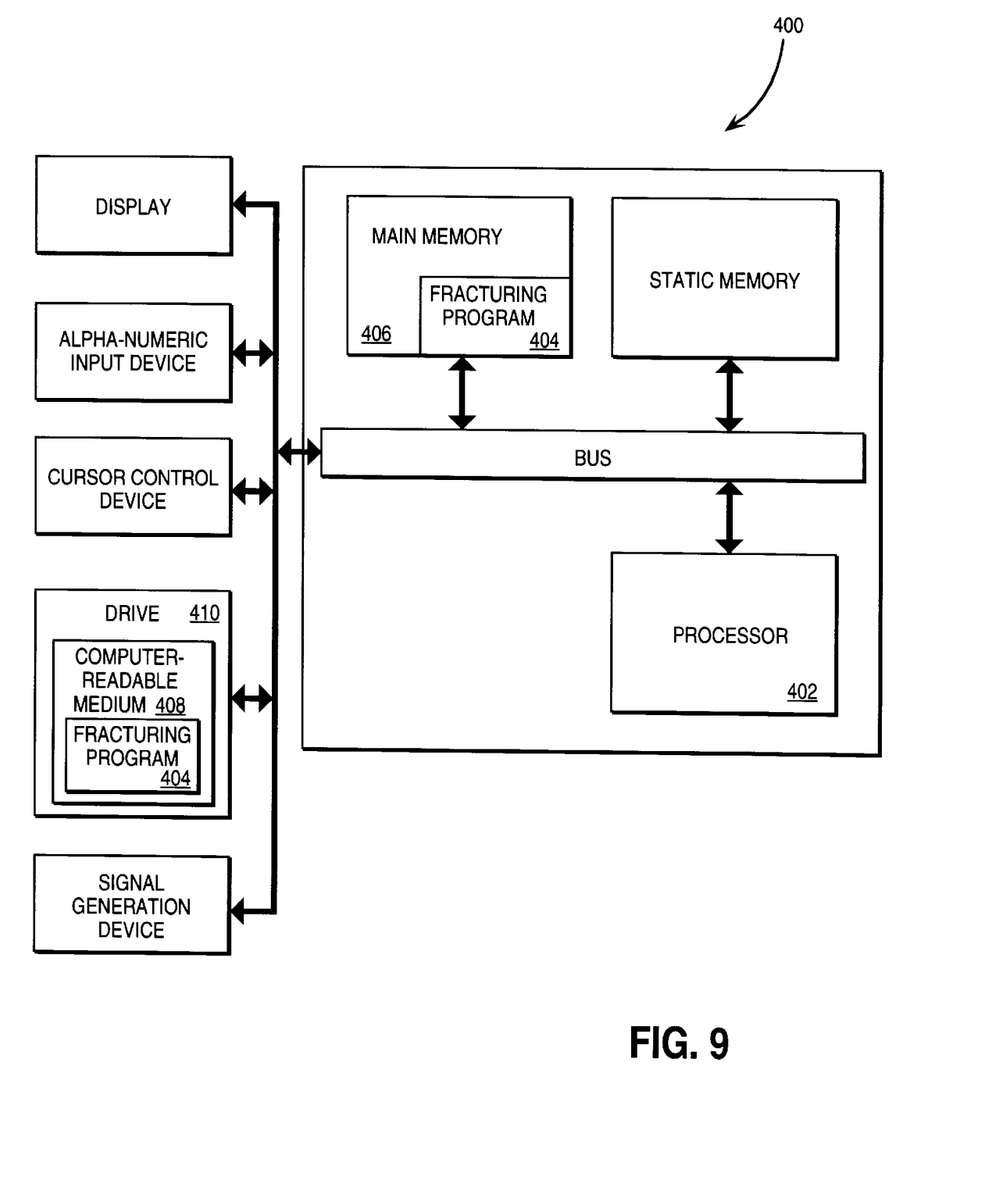
FIG. 9 is a diagrammatic representation of a computer system on which the present invention could be implemented.

Referring to FIG. 9, there is shown a computer system 400 on which the present invention can be implemented. The computer system 400 includes a processor 402 for performing each of the steps and decisions described above. Specifically, the processor 402 is configurable by a sequence of instructions, to perform each step described above. The sequence of instructions to configure the processor 402 comprises a computer program, herein conveniently termed a "fracturing program" 404. During execution of the fracturing program 404 by processor 402, the program 404 may be at least partially stored in a main memory 406 of the computer system 400. The program 404 is also stored on a computer-readable medium 408, for example a magnetic or optical disk, which is accessed via drive 410.

The above described methods of producing a reduced resistive network and of generating an electromigration violation map are particularly advantageous in that, while sacrificing a degree of accuracy by using the largest possible fragments of a Manhattan polygon for the purposes of producing a full resistive network, the methods allow for the creation of a very compact reduced resistive network. The compact reduced resistor network is advantageous in that it can be used to produce simulated electrical characteristics for a dense IC in a shorter time period than was possible utilizing prior art methods.

The method of fracturing a polygon described above is also very simple, and results in polygon fragments in the form of rectangles which can be utilized in a convenient manner to produce a full resistor network. The full resistor network is generated to have a structure which lends itself to quick reduction. The above factors all contribute to reducing the time required to simulate direct current flow within the power net of an IC. As the density of ICs increases, and development schedules become more demanding, the provision of a speedy simulation technique is particularly advantageous.

Thus, a method of extracting a resistor network from an integrated circuit (IC) polygon layout has been described. Although the present invention has been described with reference to specific exemplary embodiments, it will be evident that various modifications and changes may be made to these embodiments without departing from the broader spirit and scope of the invention. Accordingly, the specification and drawings are to be regarded in an illustrative rather than a restrictive sense.

What is claimed is:

1. The method of determining the electrical characteristics of an integrated circuit, wherein the integrated circuit is represented by a polygon layout including a Manhattan polygon defined by a plurality of boundary lines, the method comprising:

fracturing the entire Manhattan polygon into a plurality of rectangles along division lines that extend from each intersection point at which the boundary lines of the Manhattan polygon intersect to define an angle of 270 degrees within the Manhattan polygon, the division lines extending substantially parallel to the boundary lines;

substituting each of the plurality of rectangles, as defined within the Manhattan polygon exclusively by the fracturing of the Manhattan polygon along the division lines, with a respective resistor arrangement comprising four resistors and four contact nodes located electrically to couple the respective resistor arrangement to a full resistor network having a first set of nodes, each of the four resistors being connected between a common node and a respective one of the four contact nodes in a star configuration and the full resistor network comprising a simple resistor network representative of the entire Manhattan polygon;

reducing the full resistor network by removing from the full resistor network a resistor that is connected to a free node to produce a reduced resistor network having a second set of nodes;

storing data concerning a resistor value and a location of each resistor involved in the reduction step;

simulating operation of the reduced resistor network to determine operational voltages at the second set of nodes;

determining operational voltages at at least two nodes of the first set of nodes of the full resistor network utilizing the operational voltages at the second set of nodes and the stored data;

determining an operational current through at least one resistor in the full resistor network utilizing the operational voltages at the at least two nodes of the first set of nodes; and identifying an electromigration violation if the operational current through the at least one resistor exceeds a predetermined threshold value.

2. The method of claim 1 wherein the step of storing comprises storing the data concerning the resistance value and location of each removed resistor.

3. The method of claim 1 wherein the reduction comprises combining a pair of serial resistors into a single resistor.

4. The method of claim 3 wherein the storing comprises storing the data concerning the resistance value and the location of each resistor of the pair of serial resistors.

5. The method of claim 1 wherein the reduction comprises combining a pair of parallel resistors into a single resistor.

6. The method of claim 5 wherein the storing comprises storing the data concerning the resistance value and the location of each resistor of the pair of parallel resistors.

7. The method of claim 1 wherein the reduction comprises performing a star to triangle resistor configuration transformation.

8. The method of claim 7 wherein the storing comprises storing the data concerning the resistance value and the location of each resistor of the star resistor configuration.

9. A machine-readable medium having stored thereon a sequence of instructions which, when executed by a machine, cause the machine to perform the steps of:

fracturing an entire Manhattan polygon, included within a polygon layout of an integrated circuit, into a plurality of rectangles along division lines that extend from each intersection point at which boundary lines of the Manhattan polygon intersect to define an angle of 270 degrees within the Manhattan polygon, the division lines extending substantially parallel to the boundary lines;

substituting each of the plurality of rectangles, as defined within the Manhattan polygon exclusively by fracturing the Manhattan polygon along the division lines, with a respective resistor arrangement comprising four resistors and four contact nodes located electrically to couple the respective resistor arrangement to a full resistor network having a first set of nodes, each of the four resistors being connected between a common node and a respective one of the four contact nodes in a star configuration and the full resistor network comprising a simple resistor network representative of the entire Manhattan polygon;

reducing the full resistor network by removing from the full resistor network a resistor that is connected to a free node to produce a reduced resistor network having a second set of nodes;

storing data concerning a resistor value and a location of each resistor involved in the reduction step;

simulation operation of the reduced resistor network to determine operational voltages at the second set of nodes;

determining operational voltages at at least two nodes of the first set of nodes of the full resistor network utilizing the operational voltages at the second set of nodes and the stored data;

determining an operational current through at least one resistor in the full resistor network utilizing the operational voltages at the at least two nodes of the first set of nodes; and identifying an electromigration violation if the operational current through the at least one resistor exceeds a predetermined threshold value.

\* \* \* \* \*